United States Patent
Zhang et al.

(10) Patent No.: US 11,149,341 B2
(45) Date of Patent: Oct. 19, 2021

(54) MASK PLATE AND MANUFACTURE METHOD THEREOF, MASK ASSEMBLY AND VAPOR DEPOSITION APPARATUS

(71) Applicants: BOE Technology Group Co., Ltd., Beijing (CN); Ordos Yuansheng Optoelectronics Co., Ltd., Ordos (CN)

(72) Inventors: Xinjian Zhang, Beijing (CN); Liguo Liu, Beijing (CN); Zhi Yin, Beijing (CN)

(73) Assignees: BOE TECHNOLOGY GROUP CO., LTD., Beijing (CN); ORDOS YUANSHENG OPTOELECTRONICS CO., LTD., Ordos (CN)

( * ) Notice: Subject to any disclaimer, the term of this patent is extended or adjusted under 35 U.S.C. 154(b) by 0 days.

(21) Appl. No.: 16/043,260

(22) Filed: Jul. 24, 2018

(65) Prior Publication Data

US 2019/0203334 A1 Jul. 4, 2019

(30) Foreign Application Priority Data

Jan. 2, 2018 (CN) .......................... 201810002259.8

(51) Int. Cl.
*C23C 14/04* (2006.01)
*H01L 51/00* (2006.01)
*B05C 21/00* (2006.01)
*H01L 51/56* (2006.01)

(52) U.S. Cl.
CPC .......... *C23C 14/042* (2013.01); *B05C 21/005* (2013.01); *H01L 51/0011* (2013.01); *H01L 51/56* (2013.01)

(58) Field of Classification Search
None
See application file for complete search history.

(56) References Cited

U.S. PATENT DOCUMENTS

| 2011/0168087 A1* | 7/2011 | Lee ........................ C23C 14/042 118/504 |
| 2011/0179996 A1* | 7/2011 | Park ....................... C23C 14/042 118/504 |
| 2016/0310988 A1* | 10/2016 | Lee ........................... H01L 51/00 |
| 2017/0065989 A1* | 3/2017 | Reichert ................. B44B 5/026 |

* cited by examiner

*Primary Examiner* — Jethro M. Pence
(74) *Attorney, Agent, or Firm* — Fay Sharpe LLP

(57) ABSTRACT

A mask plate and manufacturing method thereof, a mask assembly and a vapor deposition apparatus are provided. The mask plate includes a mask pattern region, and a peripheral region of the mask pattern region, the peripheral region including a recess structure, and a recess direction of the recess structure being parallel to a thickness direction of the mask plate. When the glass substrate is superposed on the mask plate, the force suffered by the glass substrate at the weld pad is reduced, and the probability of scratching the glass substrate is lowered.

20 Claims, 5 Drawing Sheets

Producing a mask plate including a mask pattern region and a peripheral region of the mask pattern region; wherein the peripheral region includes a recess structure, and a recess direction of the recess structure is parallel to a thickness direction of the mask plate — 801

FIG. 8

MASK PLATE AND MANUFACTURE METHOD THEREOF, MASK ASSEMBLY AND VAPOR DEPOSITION APPARATUS

CROSS-REFERENCE TO RELATED APPLICATION

This application claims priority to Chinese Patent Application No. 201810002259.8, filed with the State Intellectual Property Office on Jan. 2, 2018 and titled "MASK PLATE AND MANUFACTURE METHOD THEREOF, MASK ASSEMBLY AND VAPOR DEPOSITION APPARATUS", the entire contents of which are incorporated herein by reference.

TECHNICAL FIELD

The present disclosure relates to a mask plate and manufacturing method thereof, a mask assembly and a vapor deposition apparatus.

BACKGROUND

Organic light-emitting diodes (OLED) display devices are more and more widely used, and generally OLED display devices are manufactured by using a mask assembly in a vapor deposition apparatus.

The mask assembly generally includes a mask plate and a mask frame. When the mask assembly is manufactured, generally the mask plate is firstly aligned with and superposed on the mask frame, and then the mask plate and the mask frame are welded together. In the related art, during the process of welding the mask plate and the mask frame, laser is generally emitted to the mask plate from a side of the mask plate away from the mask frame, such that the mask plate and the mask frame are welded under the effect of the laser. In addition, during the process of forming a mask pattern on a substrate glass by using the mask assembly, the glass substrate may be superposed on a side of the mask plate away from the mask frame.

SUMMARY

There are provided in the present disclosure a mask plate and manufacturing method thereof, a mask assembly and a vapor deposition apparatus.

In an aspect, there is provided a mask plate, comprising: a mask pattern region, and a peripheral region of the mask pattern region; wherein the peripheral region comprises a recess structure, a recess direction of the recess structure being parallel to a thickness direction of the mask plate.

Optionally, the recess structure is a step disposed on an edge of the peripheral region, the edge being away from the mask pattern region.

Optionally, the recess structure is a groove.

Optionally, the peripheral region comprises at least one group of recess structures, each group of recess structures comprising two recess structures disposed oppositely on two sides of the mask pattern region.

Optionally, the recess structure is an annular recess structure enclosing the mask pattern region.

Optionally, the mask pattern region is a rectangular region, and the recess structure is a rectangular annular recess structure enclosing the mask pattern region.

Optionally, the recess structure has a maximum recess depth greater than 15 µm.

Optionally, the mask plate is made of an invar alloy.

In another aspect, there is provided a manufacture method of a mask plate, the mask plate being the above mask plate, the method comprising: producing a mask plate including a mask pattern region and a peripheral region of the mask pattern region; wherein the peripheral region comprises a recess structure, and a recess direction of the recess structure is parallel to a thickness direction of the mask plate.

Optionally, the manufacturing a mask plate comprising a mask pattern region and a peripheral region of the mask pattern region comprises: providing a substrate; forming the mask pattern region on the substrate; and forming the recess structure on the substrate by means of etching to obtain the mask plate.

Optionally, the etching is semi-etching.

Optionally, the recess structure is a step disposed on an edge of the peripheral region, the edge being away from the mask pattern region.

Optionally, the recess structure is a groove.

Optionally, the recess structure has a maximum recess depth greater than 15 µm.

In yet another aspect, there is provided a mask assembly, comprising the above mask plate.

Optionally, the mask assembly further comprises a mask frame, the mask plate being welded to the mask frame; and the recess structure is disposed on a side of the mask plate that is away from the mask frame.

In still yet another aspect, there is provided a vapor deposition apparatus, comprising the above mask assembly.

BRIEF DESCRIPTION OF THE DRAWINGS

FIG. 8 is a flowchart of a method for manufacturing a mask plate according to an embodiment of the present disclosure.

DETAILED DESCRIPTION

For a clearer description of the principles and advantages of the present disclosure, the present disclosure is further described in detail with reference to the accompanying drawings.

Figure 1:
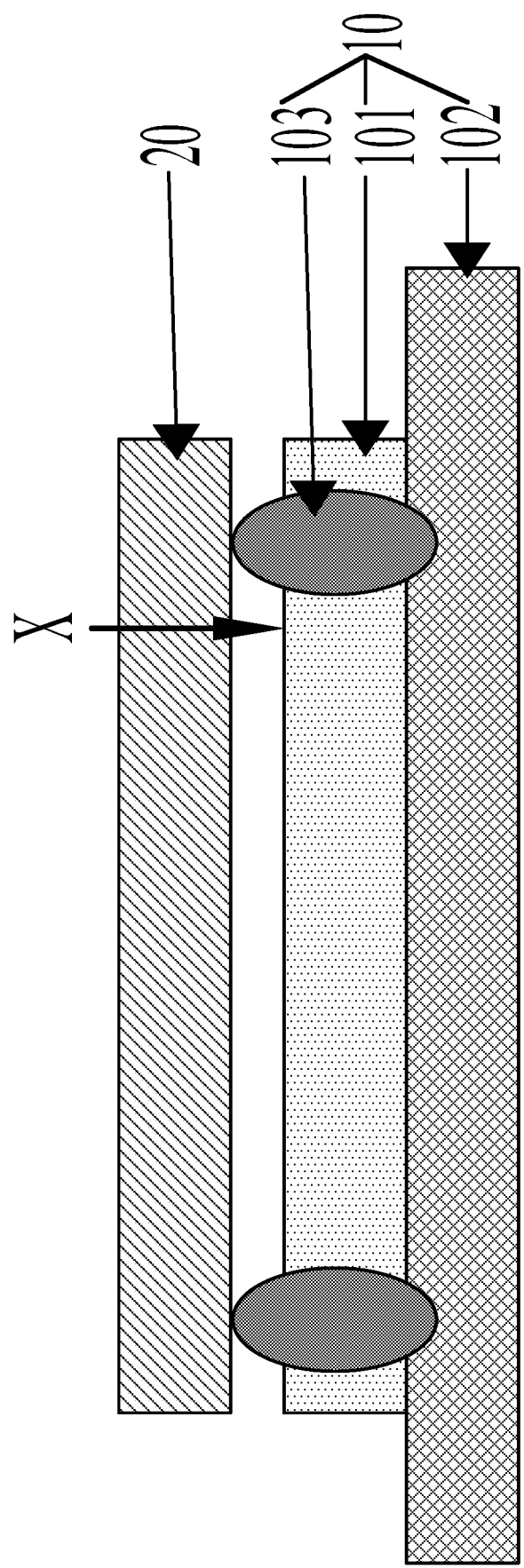
FIG. 1 is a schematic view of superposing a glass substrate onto a mask assembly according to an embodiment of the present disclosure.

FIG. 1 is a schematic view of superposing a glass substrate onto a mask assembly according to an embodiment of the present disclosure. As illustrated in FIG. 1, a mask assembly 10 generally includes a mask plate 101 and a mask frame 102. When the mask assembly 10 is manufactured, the mask plate 101 is generally aligned with and superposed on the mask frame 102, laser is emitted by a laser welder (not illustrated in FIG. 1) to the mask plate 101 from a side of the mask plate 101 away from the mask frame 102, such that the mask plate 101 and the mask frame 102 are welded under the effect of the laser.

When the laser welder emits laser to a surface X on a side of the mask plate 101 away from the mask assembly 102, the material in the mask plate 101 may be evaporated and thus form a small aperture (not illustrated in FIG. 1). The small aperture may absorb heat generated by the incident laser, and the heat absorbed by the small aperture may be transferred from an inner wall of the small aperture to a periphery thereof, such that the metal in the periphery of the wall of the aperture is molten. When the laser welder stops emitting laser to the surface of the mask plate 101, the molten metal in the periphery of the wall of the aperture may fill the aperture and then cooled, such that a weld pad 103 protruding from the surface X of the mask plate 101 is formed.

When an OLED display apparatus is manufactured, generally a glass substrate is aligned with and superposed on the mask plate 103 in the mask assembly 10, and a mask pattern is formed on the glass substrate 20. When the glass substrate 20 is aligned with and superposed on the side of the mask plate 101 away from the mask frame 102, the glass substrate 20 may be in contact with the weld pad 103. In this case, the weld pad 103 protruding from the surface X of the mask plate may simply scratch the glass substrate 20.

In some embodiments of the present disclosure, a mask plate is provided. With the mask plate, the problem that the glass substrate is simply scratched during superposing the glass substrate on the mask plate.

Figure 2:
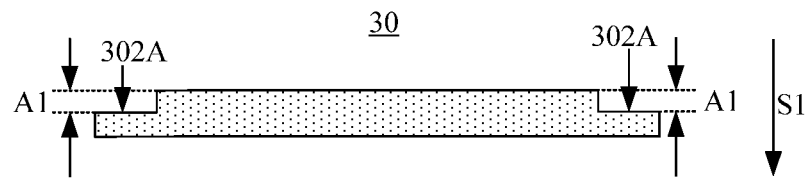
FIG. 2 is a cross-sectional view of a mask plate according to an embodiment of the present disclosure.
Figure 3:
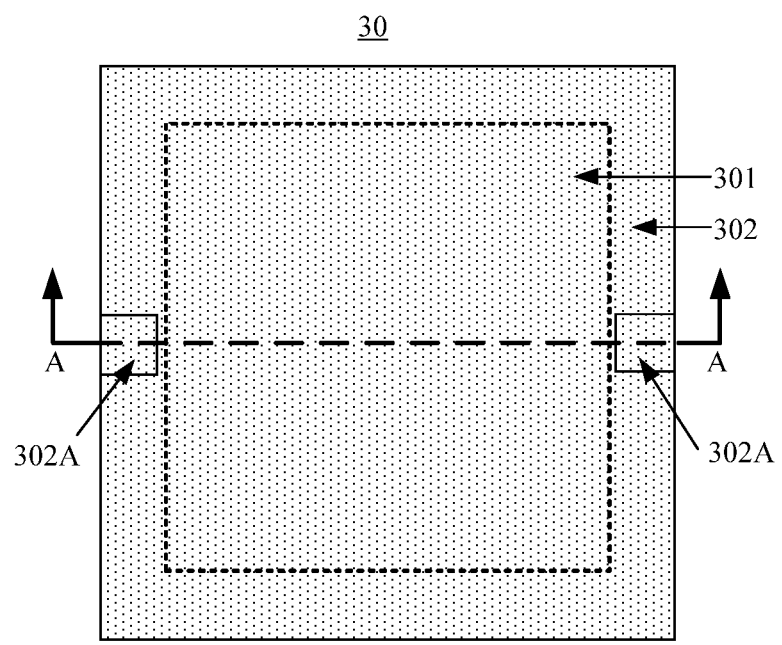
FIG. 3 is a top view of a mask plate according to an embodiment of the present disclosure.

FIG. 2 is a cross-sectional view of a mask plate according to an embodiment of the present disclosure, and FIG. 3 is a top view of a mask plate according to an embodiment of the present disclosure. It should be noted that the cross-section in FIG. 2 is the view of cross-section A-A of the mask plate 30 in FIG. 3.

In combination with FIG. 2 and FIG. 3, the mask plate 30 may include a mask pattern region 301, and a peripheral region 302 of the mask pattern region 301. The peripheral region 302 may include a recess structure 302A, and a recess direction S1 of the recess structure 302A is parallel to a thickness direction of the mask plate.

It may be noted that in the mask plate according to the embodiment of the present disclosure, the recess structure is formed in the peripheral region of the mask pattern region. When the mask plate is aligned with and superposed on the mask frame, the recess structure may be arranged to be away from the mask frame. During the process of welding the mask plate and the mask frame, laser may be emitted to the recess structure of the mask plate from a side of the mask plate away from the mask frame (that is, a side on which the recess structure is disposed), such that a weld pad formed during the welding process is partially disposed in the recess structure. In this way, protrusion of the weld pad from the mask plate is mitigated. Therefore, when the glass substrate is superposed on the mask plate, the force suffered by the glass substrate at the weld pad is reduced, and the probability of scratching the glass substrate is lowered.

Optionally, a maximum recess depth A1 of the recess structure 302A may be greater than 15 μm. Since the protrusion portion of the weld pad formed during the welding process generally has a height of about 15 μm, when the recess depth A1 of the recess structure is greater than 15 μm, it is ensured that the weld pad does not protrude from the mask plate, which further reduces the probability that the glass substrate is scratched by the weld pad.

Optionally, the mask plate 30 may be made of an invar alloy. Since the invar alloy has a low thermal expansion coefficient, when the mask plate made of the invar alloy is welded to the mask frame, thermal deformation of the mask plate is small. In practice, the mask plate 30 may also be made of other materials having a low thermal expansion coefficient, for example, an aluminum-silicon alloy, which is not limited in the embodiment of the present disclosure.

Optionally, still referring to FIG. 2 and FIG. 3, the recess structure 302A may be a step on an edge of a peripheral region 302 away from the mask pattern region 301. In this case, the recess structure 302A passes through a side face of the mask plate.

Optionally, the peripheral region 302 may include at least one group of recess structures, and each group of recess structures may include: two recess structures 302A oppositely arranged on two sides of the mask pattern region 301. When the recess structures 302A are disposed on the two sides of the mask pattern region 301, since two sides of the mask plate 30 may be both welded to the mask frame during the process of welding the mask plate 30 and the mask frame, the stability of the mask plate 30 is enhanced. FIG. 3 uses the scenario where the peripheral region 302 includes one group of recess structures as an example. In practice, the peripheral region 302 may further include a plurality of groups of recess structures (for example, two groups of recess structures), which is not limited in the embodiment of the present disclosure.

Figure 4:
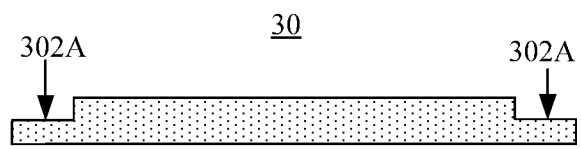
FIG. 4 is a side view of a mask plate according to an embodiment of the present disclosure.
Figure 5:
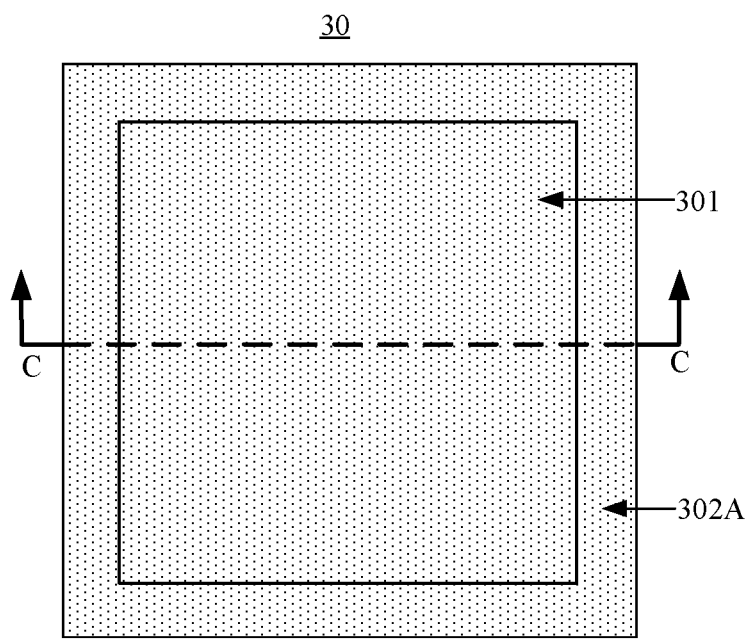
FIG. 5 is a top view of another mask plate according to an embodiment of the present disclosure.

FIG. 4 is a side view of a mask plate according to an embodiment of the present disclosure, and FIG. 5 is a front view of another mask plate according to an embodiment of the present disclosure. It should be noted that the sectional view illustrated in FIG. 4 is a schematic view of a cross section C-C of the mask plate 30 in FIG. 5. Referring to FIG. 4 and FIG. 5, the recess structure 302A is an annular recess structure enclosing the mask pattern region 301. In this case, the peripheral region of the mask plate 30 is formed by the recess structures 302A. When the recess structure 302A is an annular recess structure enclosing the mask pattern region 301, the surrounding of the mask plate 30 may be welded to the mask frame. In this way, the stability of the mask plate 30 is further enhanced.

Optionally, the mask pattern region 301 may be a rectangular region. In this case, the annular recess structure 302A is a rectangular annular recess structure. In practice, the mask pattern region 301 may be a region of other shapes, for example, a circular region, and the annular recess structure 302A may also be a circular annular recess structure, which is not limited in the embodiment of the present disclosure.

Figure 6:
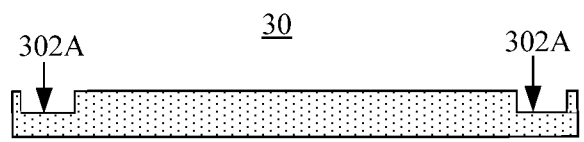
FIG. 6 is a cross-sectional view of another mask plate according to an embodiment of the present disclosure.
Figure 7:
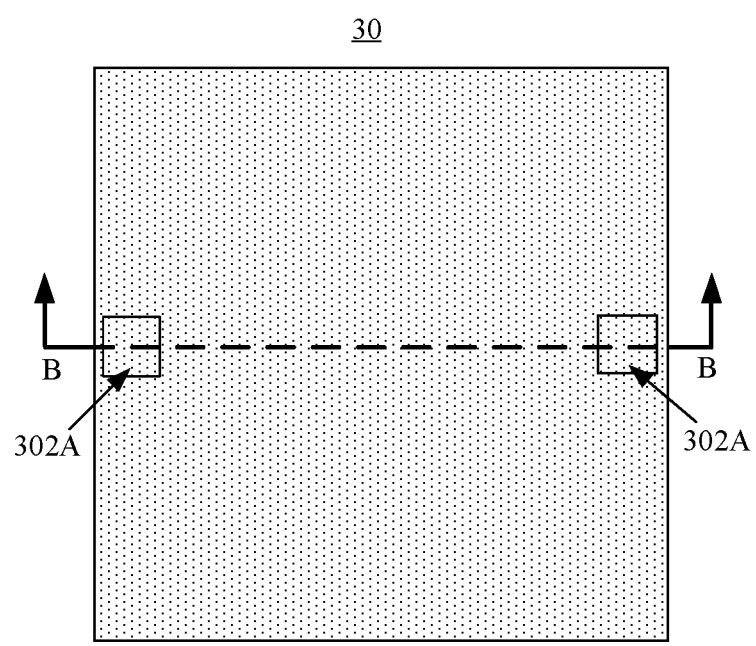
FIG. 7 is a top view of yet another mask plate according to an embodiment of the present disclosure.

FIG. 6 is a schematic sectional view of another mask plate according to an embodiment of the present disclosure. FIG. 7 is a front view of another mask plate according to an embodiment of the present disclosure. It should be noted that the sectional view illustrated in FIG. 6 is a schematic view of a cross section B-B of the mask plate 30 in FIG. 7. Referring to FIG. 6 and FIG. 7, the recess structure 302A may also be a groove.

Optionally, the peripheral region may include at least one group of grooves, and each group of grooves may include: two grooves oppositely arranged on two sides of the mask pattern region. Optionally, the groove may be an annular groove enclosing the mask pattern region, which will not be repeated in the embodiments of the present disclosure.

In summary, in the mask plate according to the embodiment of the present disclosure, the recess structure is formed in the peripheral region of the mask pattern region. When the mask plate is aligned with and superposed on the mask frame, the recess structure may be arranged to be away from the mask frame. During the process of welding the mask plate and the mask frame, laser may be emitted to the recess structure of the mask plate from a side of the mask plate away from the mask frame (that is, a side on which the recess structure is disposed), such that a weld pad formed during the welding process is partially disposed in the recess structure. In this way, protrusion of the weld pad from the mask plate is mitigated. Therefore, when the glass substrate is superposed on the mask plate, the force suffered by the glass substrate at the weld pad is reduced, and the probability of scratching the glass substrate is lowered.

FIG. 8 is a flowchart of a manufacture method of a mask plate according to an embodiment of the present disclosure. The manufacture method may be used to manufacture a mask plate as illustrated in FIG. 2 to FIG. 7. As illustrated in FIG. 8, the manufacture method may include the following steps:

In step 801, a mask plate including a mask pattern region and a peripheral region of the mask pattern region is produced; wherein the peripheral region includes a recess structure, and a recess direction of the recess structure is parallel to a thickness direction of the mask plate.

Exemplarily, when the mask plate is manufactured, a substrate may be firstly provided. The substrate may be a rectangular solid substrate, and the substrate may be made of a non-transparent material. Afterwards, the mask pattern region may be formed on the substrate, for example, the mask pattern region is formed by means of etching the substrate. Finally, the recess structure is formed on the substrate (a periphery of the mask pattern region) by means of etching, and the mask plate is obtained. Optionally, in the above embodiment of the present disclosure, during etching of the substrate, the substrate on which the recess structure is to be formed may not be totally removed by etching. Therefore, this etching process is also referred to as a semi-etching process.

Optionally, the obtained recess structure may be a step arranged on an edge of the peripheral region away from the mask pattern region. Optionally, the recess structure obtained in step 8013 may also be a groove. Optionally, a maximum recess depth of the recess structure may be greater than 15 μm.

It should be noted that the step for forming the mask pattern region may be prior to the step of forming the recess structure, and the step of forming the mask pattern region may also be behind the step of forming the recess structure, which is not limited in the embodiment of the present disclosure.

In summary, in the mask plate manufactured by using the manufacture method according to the embodiment of the present disclosure, the recess structure is formed in the peripheral region of the mask pattern region. When the mask plate is aligned with and superposed on the mask frame, the recess structure may be arranged to be away from the mask frame. During the process of welding the mask plate and the mask frame, laser may be emitted to the recess structure of the mask plate from a side of the mask plate away from the mask frame (that is, a side on which the recess structure is disposed), such that a weld pad formed during the welding process is partially disposed in the recess structure. In this way, protrusion of the weld pad from the mask plate is mitigated. Therefore, when the glass substrate is superposed on the mask plate, the force suffered by the glass substrate at the weld pad is reduced, and the probability of scratching the glass substrate is lowered.

Figure 9:
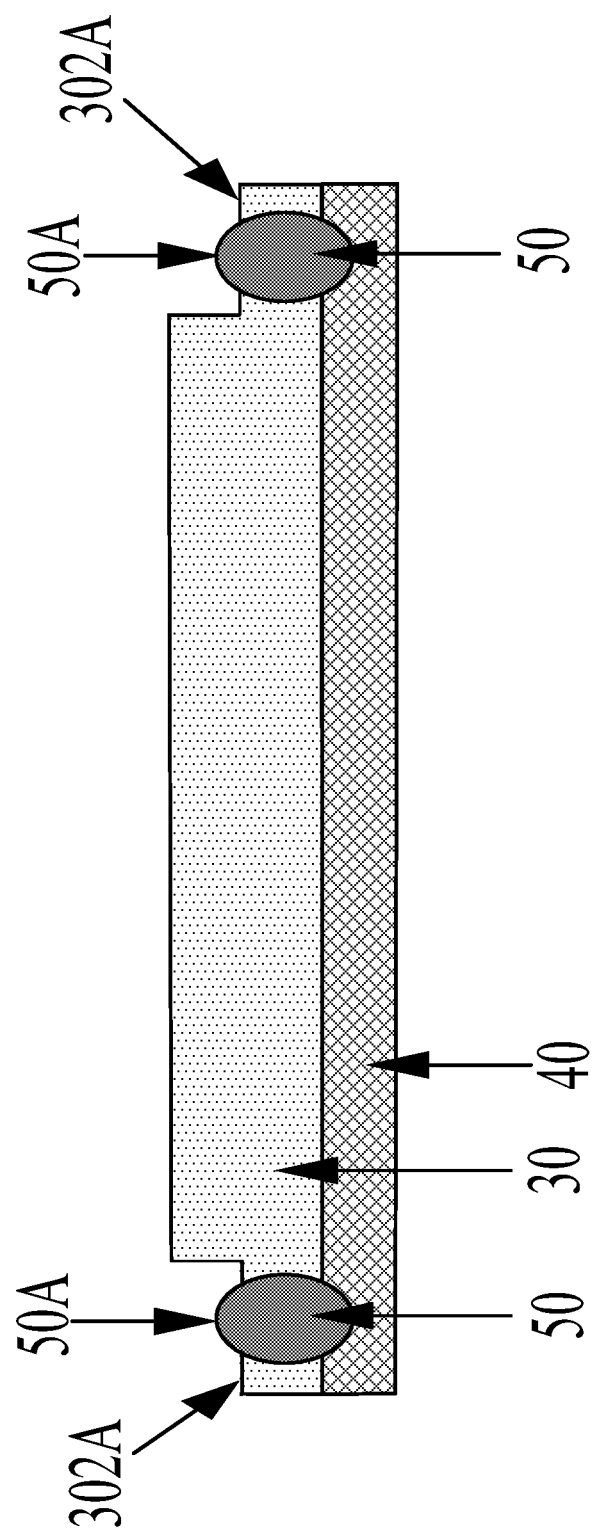
FIG. 9 is a cross-sectional view of a mask assembly according to an embodiment of the present disclosure.

FIG. 9 is a schematic sectional view of a mask assembly according to an embodiment of the present disclosure. As illustrated in FIG. 9, the mask assembly may include a mask plate 30 and a mask frame 40. It should be noted that the mask plate 30 as illustrated in FIG. 9 may be any mask plate as illustrated in FIG. 2 to FIG. 7. In FIG. 9, only the mask plate as illustrated in FIG. 2 or FIG. 3 is used as an example.

As illustrated in FIG. 9, the mask plate 30 is welded to the mask frame 40, and a recess structure 302A in the mask plate 30 is disposed on a side of the mask plate 30 away from the mask frame 40. After the mask plate 30 and the mask frame 40 are welded, a protrusion portion 50A on a weld pad 50 formed is disposed in the recess structure 302A.

In some embodiments of the present disclosure, a vapor deposition apparatus is further provided. The vapor deposition apparatus may include the mask assembly as illustrated in FIG. 9.

In summary, in the mask assembly according to the embodiments of the present disclosure, during the process of welding the mask plate and the mask frame, laser may be emitted to the recess structure of the mask plate from a side of the mask plate away from the mask frame (that is, a side on which the recess structure is disposed), such that a weld pad formed during the welding process is partially disposed in the recess structure. In this way, protrusion of the weld pad from the mask plate is mitigated. Therefore, when the glass substrate is superposed on the mask plate, the force suffered by the glass substrate at the weld pad is reduced, and the probability of scratching the glass substrate is lowered.

Persons of ordinary skill in the art may derive other embodiments based on the present disclosure upon consideration of the description and practices of the embodiments of the present disclosure. The present disclosure is intended to cover any variations, uses and applicable modifications following the general principles of the present disclosure and including the common knowledge or conventional techniques in the art. The description and embodiments are exemplary only, and the true scope and spirits of the present disclosure are indicated by the claims.

What is claimed is:

1. A mask plate, comprising: a mask pattern region, and a peripheral region surrounding the mask pattern region, the peripheral region being a part of the mask plate, and the mask plate being a one-piece structure;
   wherein the peripheral region comprises a recess structure, a recess direction of the recess structure is parallel to a thickness direction of the mask plate, and the recess structure is a step or groove disposed on an edge of the peripheral region, the edge being an edge of the mask plate furthest away from the mask pattern region, and
   a weld pad is partially disposed in the recess structure and the weld pad is configured for connecting the mask plate and a mask frame, the recess structure and the weld pad configured to not contact a glass substrate superimposed on the mask plate and in direct contact with an upper top surface of the step or groove.

2. The mask plate according to claim 1, wherein the peripheral region comprises at least one group of the recess structures, each group of the recess structures comprising two of the recess structures disposed oppositely on two sides of the mask pattern region.

3. The mask plate according to claim 1, wherein the recess structure has a maximum recess depth greater than 15 μm.

4. The mask plate according to claim 1, wherein the mask plate is made of an invar alloy.

5. The mask plate according to claim 1, wherein the mask plate is made of an aluminum-silicon alloy.

6. The mask plate according to claim 1, wherein the recess structure is an annular recess structure enclosing the mask pattern region.

7. The mask plate according to claim 6, wherein the mask pattern region is a rectangular region, and the annular recess structure is a rectangular annular recess structure.

8. A manufacture method of a mask plate, comprising:
producing a mask plate including a mask pattern region and a peripheral region surrounding the mask pattern region, the peripheral region being a part of the mask plate, and the mask plate being a one-piece structure;
wherein the peripheral region comprises a recess structure, a recess direction of the recess structure is parallel to a thickness direction of the mask plate, and the recess structure is a step or groove disposed on an edge of the peripheral region, the edge being an edge of the mask plate furthest away from the mask pattern region, and
a weld pad is partially disposed in the recess structure and the weld pad is configured for connecting the mask plate and a mask frame, the recess structure and the weld pad configured to not contact a glass substrate superimposed on the mask plate and in direct contact with an upper top surface of the step or groove.

9. The method according to claim 8, wherein producing a mask plate including a mask pattern region and a peripheral region of the mask pattern region comprises:
providing a substrate;
forming the mask pattern region on the substrate; and
forming the recess structure on the substrate by means of an etching mode to obtain the mask plate.

10. The method according to claim 8, wherein the recess structure has a maximum recess depth greater than 15 μm.

11. The method according to claim 9, wherein the etching mode is semi-etching mode.

12. A mask assembly, comprising a mask plate which comprises a mask pattern region and a peripheral region surrounding the mask pattern region, the peripheral region being a part of the mask plate, and the mask plate being a one-piece structure;
wherein the peripheral region comprises a recess structure, a recess direction of the recess structure is parallel to a thickness direction of the mask plate, and the recess structure is a step or groove disposed on an edge of the peripheral region, the edge being an edge of the mask plate furthest away from the mask pattern region, and
a weld pad is partially disposed in the recess structure and the weld pad is configured for connecting the mask plate and a mask frame, the recess structure and the weld pad configured to not contact a glass substrate superimposed on the mask plate and in direct contact with an upper top surface of the step or groove.

13. The mask assembly according to claim 12, wherein the mask assembly further comprises a mask frame, the mask plate is welded to the mask frame, and the recess structure is disposed on a side of the mask plate that is away from the mask frame.

14. A vapor deposition apparatus, comprising the mask assembly according to claim 12.

15. The mask assembly according to claim 12, wherein the peripheral region comprises at least one group of the recess structures, each group of the recess structures comprising two of the recess structures disposed oppositely on two sides of the mask pattern region.

16. The mask assembly according to claim 12, wherein the recess structure has a maximum recess depth greater than 15 μm.

17. The mask assembly according to claim 12, wherein the mask plate is made of an invar alloy.

18. The mask assembly according to claim 12, wherein the mask plate is made of an aluminum-silicon alloy.

19. The mask assembly according to claim 12, wherein the recess structure is an annular recess structure enclosing the mask pattern region.

20. The mask assembly according to claim 19, wherein the mask pattern region is a rectangular region, and the annular recess structure is a rectangular annular recess structure.

* * * * *